United States Patent [19]

Topich, deceased et al.

[11] Patent Number: 4,748,593

[45] Date of Patent: May 31, 1988

[54] HIGH SPEED NONVOLATILE MEMORY CELL

[75] Inventors: James A. Topich, deceased, late of Centerville, by Susan K. Topich, executor; Raymond A. Turi, Miamisburg; George C. Lockwood, Dayton, all of Ohio

[73] Assignee: NCR Corporation, Dayton, Ohio

[21] Appl. No.: 904,586

[22] Filed: Sep. 8, 1986

[51] Int. Cl.[4] .................... G11C 7/00

[52] U.S. Cl. .................... 365/190; 365/185

[58] Field of Search .................... 365/182, 184, 185, 154, 365/190; 357/23.5

[56] References Cited

U.S. PATENT DOCUMENTS

| | | | |
|---|---|---|---|
| 4,288,863 | 9/1981 | Adam | 365/182 |
| 4,348,745 | 9/1982 | Schmitz | 365/154 |
| 4,467,451 | 8/1984 | Moyer | 365/185 X |

OTHER PUBLICATIONS

Miyamoto et al., "An Experimental 5-V-Only 256-kbit CMOS EEPROM with a High-Performance Single-Polysilicon Cell", *IEEE Journal of Solid-State Circuits,* vol. SC-21, No. 5, Oct. 1986, pp. 852-859.

*Primary Examiner*—Joseph A. Popek

*Attorney, Agent, or Firm*—Wilbert Hawk, Jr.; Casimer K. Salys

[57] ABSTRACT

The circuit and structure of a direct write differential nonvolatile memory cell. The features of the cell include high speed read sensing, write without a prior erase operation, single polysilicon fabrication capability, and memory margining capabilities. The structural and functional symmetry maximizes cell density while providing complementary differential operation. In a preferred arrangement, the cell utilizes a pair of cross-coupled, capacitively complementary, centrally disposed floating gate electrodes. The cell is written directly by the provision of complementary signals on a pair of program lines, which lines are capacitively coupled to the floating gate electrodes. The data state of the cell is sensed by conduction in two bit lines, the conductive states of the lines being determined by the charge transferred onto the two floating gate electrodes during the simultaneous but complementary programming of such electrodes.

15 Claims, 2 Drawing Sheets

5V
28
PROGRAM LINE NUMBER ONE
29
PROGRAM LINE NUMBER TWO
BIT LINE NUMBER ONE
BIT LINE NUMBER TWO
WORD LINE
1
8
9
11
12
COLUMN SELECT
31
32
5V
33
34
DATA OUT

HIGH SPEED NONVOLATILE MEMORY CELL

CROSS REFERENCE TO RELATED APPLICATION

The present invention is related to U.S. Pat. No. 4,683,554 to inventors Lockwood et al. and assigned to the assignee of the present invention.

BRIEF SUMMARY

The present invention relates to an electronic nonvolatile memory cell, and more particularly to a differentially configured single polysilicon memory cell having a cross-coupled pair of floating gate structures which are arranged in mirrored relationship to provide functional and structural symmetry.

The complementary arrangement of the present memory cell facilitates high speed readout of the nonvolatile data stored therein when the cell state is detected using a differential sense amplifier. Numerous benefits accrue from the symmetry exhibited by the cell, the structural symmetry being characterized by a symmetric pair of floating gate electrodes, a mirrored arrangement of the floating gate sense field effect transistors, a corresponding pair of thin dielectric regions subject to charge transfer, a paired symmetry of the capacitive coupling regions, and a symmetric placement of the program and sensing lines with respect of the composite cell structure.

Operationally the nonvolatile memory cell exhibits related characteristics of symmetry. The nonvolatile cell is programmed by providing complementary programming/writing voltages of appropriate voltage levels to the two program lines, so as to produce a first ordering in which both floating gate electrodes are written to a first pair of complementary states, and a reversal of the two programmed states with a reversal of the programming voltages. Noted additional features of the present differential nonvolatile memory cell include its direct write capability, the ability to margin the memory window, and the absence of read disturb.

A preferred embodiment of the cell employs a dense semiconductor layout which includes a rectangular central region having areas of thin dielectric for capacitive coupling and charge transfer, a pair of diffused parallel program lines situated beneath thin dielectric areas, and a pair of floating gate electrodes asymmetrically overlapping both of the diffused lines. The rectangular central region is flanked by parallel bit lines, having serially positioned sense field effect transistors individually responsive to the charge trapped on the two floating gate electrodes. Each floating gate electrode lies over a charge transfer region with respect to one program line and is capacitively coupled to the other program line.

These and other features of the invention will be more clearly understood and appreciated upon considering the ensuing detailed description.

DETAILED DESCRIPTION

Figure 1:
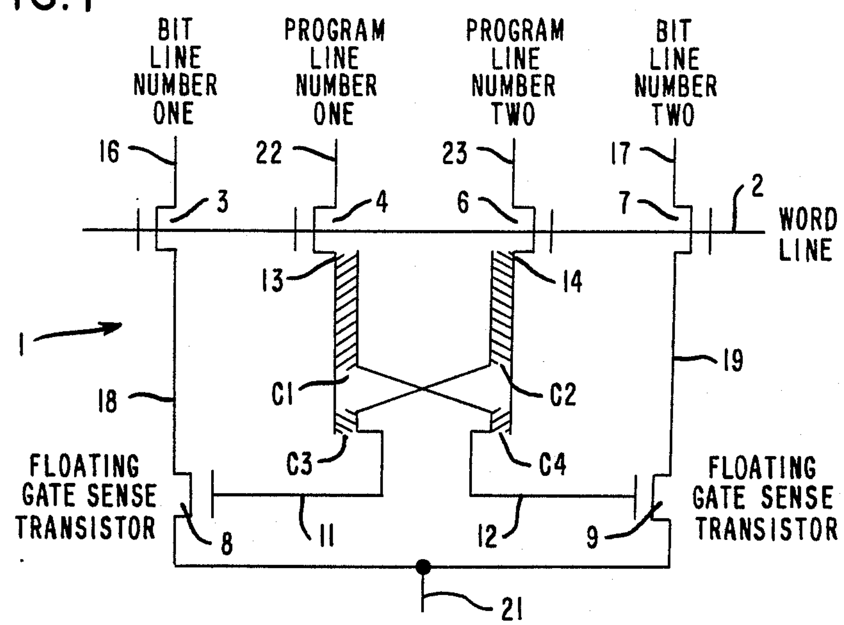
FIG. 1 is a schematic embodiment of a high speed direct write differential nonvolatile memory cell.

Integrated circuit nonvolatile memory cells which store binary data (0 or 1) for extended periods of time are generally well known. Contemporary and representative designs involve the use of MNOS or floating gate structures which are programmed by the tunneling of charged through dielectrics, the conduction of charge through dielectrics, or the injection of high energy electrons through dielectrics under the influence of electric fields. Heretofore, the cell designs were primarily influenced by the continuing pursuit of smaller dimensions with the intent of maximizing the density of nonvolatile memory arrays and minimizing chip size. As the technology developed, the cell designs provided the capability to directly write nonvolatile data, in contrast to cell structures which require a preceding erase cycle. Even more recently, there has been the goal of incorporating nonvolatile memory cells into semi-custom design technology, for instance, as one element of a cell library, with the associated need for a structure which can be fabricated in a single polysilicon layer fabrication process.

The previously cited co-pending U.S. patent application, having Ser. No. 06/775,980 to inventors Lockwood et al., is representative of an advanced single polysilicon, direct write nonvolatile memory cell. Readout speed has, however, never been a touted feature of nonvolatile memory cells as a class. To a large extent this is attributable to the earlier noted pursuit of design characteristics which provide higher array densities. The high density, small size nonvolatile memory cell structures utilize single charge storage electrode arrangements, characterized by cells whose data state is represented by the conductivity of a single charge sensing field effect transistor.

A representative cell is described in the article entitled, "And EEPROM for Microprocessors and Custom Logic" by authors Cuppens et. al, published in the 1984 *IEEE International Solid State Circuits Conference,* pp. 268, 269 and 352, and more fully describe in the article of the same name and under the same authorship which appeared in *IEEE Journal of Solid State Circuits,* Vol. SC-2, No. 2, pp. 603–608, April 1985. This nonvolatile memory cell conspicuously lacks differential features both as to structure and function.

A differentially configured nonvolatile memory cell is described in the article by Pathak et. al entitled, "A 25-ns 16K CMOS PROM Using a Four-Transistor Cell and Differential Design Techniques", which appeared in the *IEEE Journal of Solid State Circuits,* Vol. SC-20, No. 5, pp. 964–970, October 1985. However, this cell structure merely utilizes complimentary redundancy, and as a consequence employs no cross-coupling or symmetry as to either the structure or the operation. Furthermore, the structure requires multiple polysilicon layers, and lacks erase and rewrite capability, providing only PROM in contrast to EEPROM capability. Consequently, there remained a need for a reprogrammable nonvolatile memory cell which has the high speed attributes of a differential design, exhibits operational symmetry, is compact in layout, and can be fabricated with a single polysilicon electrode layer with minimum divergence from the conventions of contemporary integrated circuit fabrication processes.

The present invention is illustrated by the embodiment schematically depicted in FIG. 1 of the drawings. The high speed, direct write differential nonvolatile memory cell 1 uses as a row select common word line 2, which line ohmically connects the gate electrodes of cell access field effect transistors (FETs) 3, 4, 6 and 7. Floating gate sense FETs 8 and 9 are connected in electrical series with cell access transistors 3 and 7, respectively, and are individually responsive to the charge held on respective floating gate electrodes 11 and 12. The polarity of the charge transferred onto floating gate electrodes 11 and 12 is inherently complementary, to conductively bias one of the floating gate sense transistors 8 or 9 at a substantially higher level than the differentially situated complement. An addressing of cell access field effect transistors 3 and 7 by a select signal on word line 2 enables the conductive states of floating gate sense transistors 8 and 9 to be sensed on bit lines number one and number two using a high speed sense amplifier. The nonvolatile data state stored in memory cell 1 is read out at relatively high speed because the sense amplifier connected to bit lines number one and number two is differentially driven, in contrast to a reference level responsive sense amplifier which must await a bit line charge decay to detect the cell data.

Floating gate electrodes 11 and 12 of cell 1 are capacitively cross-coupled to source/drain diffusion electrode regions 13 and 14 of field effect transistors 4 and 6. In this respect, note that floating gate electrodes 11 is coupled by relatively small capacitor C3 to source/-drain electrode region 13, and by relatively large capacitor C2 to complementary operable source/drain electrode region 14. Correspondingly, floating gate electrode 12 is coupled through relatively small capacitor C4 to source/drain electrode region 14 and by relatively large capacitor C1 to source/drain electrode region 13. Electrode regions 13 and 14 are separated from complementary operable program lines number one (reference numeral 22) and number two (reference numeral 23) by respective cell access FETs 4 and 6, which as noted earlier are responsive to the signal on word line 2.

Figure 2:
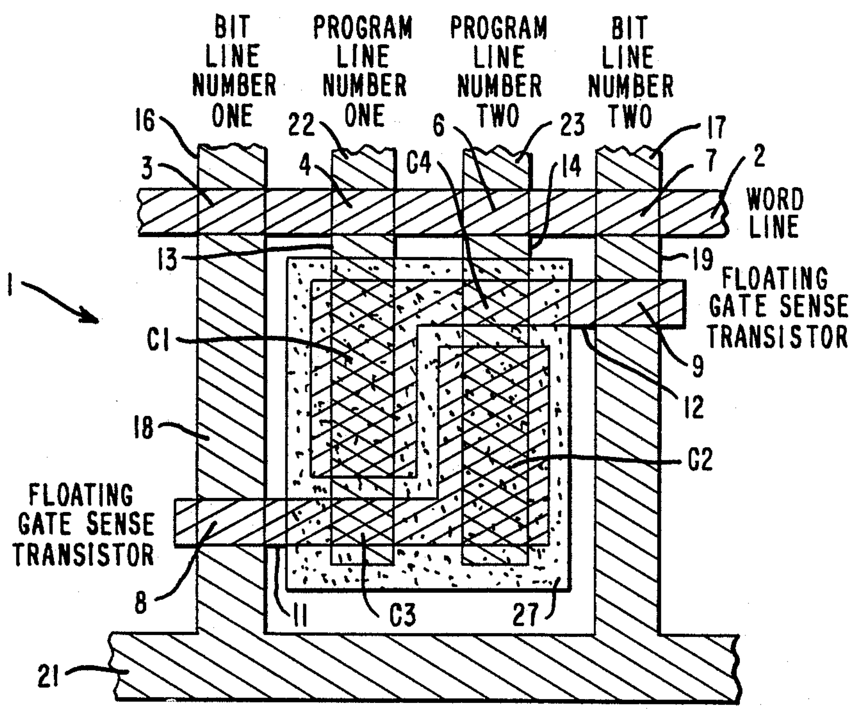
FIG. 2 is a embodying layout for a high speed direct write differential nonvolatile memory cell.

The circuit symmetry conveyed by the schematic in FIG. 1 is more vividly apparent upon considering a representative layout of high speed direct write differential nonvolatile memory cell 1, as depicted in FIG. 2. The layout in FIG. 2 depicts one representative cell from an array configuration composed of multiple nonvolatile memory cells, fabricated as an integrated circuit using a silicon semiconductor substrate and contemporary single polysilicon manufacturing techniques. As shown, complementary bit lines number one and number two, referenced as n+ doped diffused regions 16 and 17, are connected through cell access field effect transistors 3 and 7 to further n+ diffusions 18 and 19 in the pdoped p− doped silicon substrate. Preferably, this is implemented using p-wells in an n-type substrate. Floating gate sense transistors 8 and 9 are interposed respectively between diffused regions 18 and 19 and common control electrode 21. Together these patterns define commonly addressed parallel bit line paths on opposite sides of the cell.

The interior structure of the cell is comprised of program lines number one and number two, referenced as n+ diffusions 22 and 23, which upon passing through corresponding cell access field effect transistors 4 and 6 continue as conductive diffusion regions 13 and 14. Substrate diffusions 13 and 14 project in parallel through the cell interior, generally defined by dielectric fabrication mask pattern 27. As preferably embodied, word line electrode 2 and floating gate electrodes 11 and 12 are formed from a conductively doped polysilicon layer, following selective processing to create the FET gate silicon dioxides (oxides) and the thin capacitor and charge transfer oxides. Typically, field effect transistors 3, 4, 6, 7, 8 and 9 utilize a gate oxide approximately 40 nanometers thick, while the thin oxide dielectric layers in regions C1–C4 have a nominal thickness of 9 nanometers, the latter selected to match the needs of both capacitive coupling and charge transfer.

Within the region defined by dielectric fabrication mask pattern 27 polysilicon floating gate electrode 11 overlaps diffused electrode 13 in a relatively small area, to create a comparatively small capacitive coupling C3, and overlaps diffused electrode 14 in a relatively large area, to form a comparatively large capacitive coupling C2. Polysilicon floating gate electrode 12 has a complementary arrangement to that of electrode 11, in that electrode 12 overlaps diffusion 14 to form a relatively small capacitive coupling C4 and then extends over diffusion 13 to form a relatively large capacitive coupling C1. The magnitudes of the capacitors C1–C4 are defined in conventional manner by the areas of overlap and the thicknesses of the respective thin dielectric layers.

The movement of the charge to and from floating gate electrodes 11 and 12 occurs in capacitive coupling regions C3 and C4 of the respective electrodes. The thin dielectric in these regions is preferably composed of thermally grown silicon dioxide, so that charge transfer occurs in the regions C3 and C4 by Fowler-Nordheim tunneling. If, in the alternative, the thin dielectrics are composed of a silicon nitride dielectric layer, or a thin silicon oxynitride composite dielectric layer, charge transfer would occur by Poole-Frenkel conduction or a combination of such conduction with tunneling. The choice of the dielectric material for regions C1–C4 is influenced by a number of factors not central to this invention, such as capacitor area requirements, dielectric coefficients, cell retention requirements and cell endurance characteristics, which relationships are commonly known and considered by practitioners in the art.

Table A summarizes the operating conditions suitable for the direct writing of the exemplary high speed nonvolatile memory cell depicted in the FIGS. 1 and 2.

TABLE A

| Operating Conditions<br>Connection | Program/Write "0" | Program/Write "1" | Read | Margin |
|---|---|---|---|---|
| Bit Line Number One | −9V(0V) | −9V(0V) | Sense | Sense |
| Bit Line Number Two | −9V(0V) | −9V(0V) | Sense | Sense |
| Word Line | +5V(+15V) | +5V(+15V) | +5V | +5V |
| Prog. Line Number One | +5V(+15V) | −9V(0V) | +5V(0V) | 0V(TestV) |
| Prog. Line Number Two | −9V(0V) | +5V(+15V) | +5V(0V) | TestV(OV) |
| P-Well | −9V(0V) | −9V(0V) | 0V | 0V |
| Common Control Electrode | −9V(0V) | −9V(0V) | 0V | 0V |

To understand and appreciate the implications of the operating conditions set forth in Table A, each will be considered with reference to the schematics depicted in FIGS. 1 and 2. The programming or writing of differential nonvolatile memory cell 1 to retain a binary "0" state is accomplished by providing a +5 volt select signal to word line 2; providing a +5 volt signal to the program line number one, connection 22; and providing a −9 volt signal to program line number two, connection 23, both bit lines, the p-well and common control electrode 21. Under those conditions, transistors 4 and 6 are conductive so as to pass approximately +3 volts to diffusion 13 and −9 volts to diffusion 14. Because capacitive coupling C1 is significantly larger than C4, floating gate electrode 12 is pulled to +3 volts via capacitor C1. Thereby, the majority of the relative potential of approximately 10 volts (85% coupling of 12 volts) is placed across the dielectric of C4, between first layer polysilicon floating gate electrode 12 and diffusion 14. Note that a similar but polarity reversed relationship occurs for capacitor C3.

The presence of approximately 10 volts across the thin oxide, nitride or oxynitride dielectrics in capacitive coupling regions C3 and C4 initiates the transfer of charge, by tunneling for a thin oxide, from the diffusion 14 to floating gate electrode 12 of C4, coincident with a complementary, oppositely directed, tunneling of charge between diffusion 13 and floating gate electrode 11 in the region of C3. Thereby, floating gate electrodes 11 and 12 are oppositely charged in a single program/write "0" operation. Clearly, the floating gates would be similarly but oppositely charged under the program/write "1" operating conditions of Table A.

It should be noted that the programming voltages set forth in Table A presume that nonvolatile memory cell 1 is fabricated with n-channel field effect transistors in a p-well CMOS process. The features of the cell are, however, not so limited in that they are equally amendable to other CMOS, NMOS or PMOS implementations.

A particularly noteworthy feature evidenced by the foregoing description of a program/write cycle is the provision of a complementary nonvolatile write without a preceding erase operation, which erase cycle characterizes most conventional nonvolatile memory cells. This direct write capability minimizes the time associated with the programming/writing of a nonvolatile state into each cell, which time for this embodiment entails approximately 10 milliseconds.

Reference is again made to Table A, this time for a consideration of the signals used to read the binary state stored in the nonvolatile memory cell. As prescribed, the binary bit stored in nonvolatile cell 1 is detected by sensing the relative conductive states of the paths defined between bit lines number one and number two, and common control electrode 21, having interposed therebetween respective cell access FETs 3 and 7 and floating gate sense FETs 8 and 9. Preferably, from Table A, the reading of the data state in the cell involves the concurrent application of +5 volts to word line 2, to program line number one and to program line number two, and a detection of the relative conductive difference in the bit lines number one and number two.

The intrinsic threshold voltage of floating gate sense transistors 8 and 9 is approximately 1 volt. When programmed/written according to the operating condition set forth in Table A the complementary pair of sense FETs have thresholds of approximately +4 and −2 volts. The threshold voltage difference is reflected in conduction current differential for bit lines number one and number two.

Figure 3:
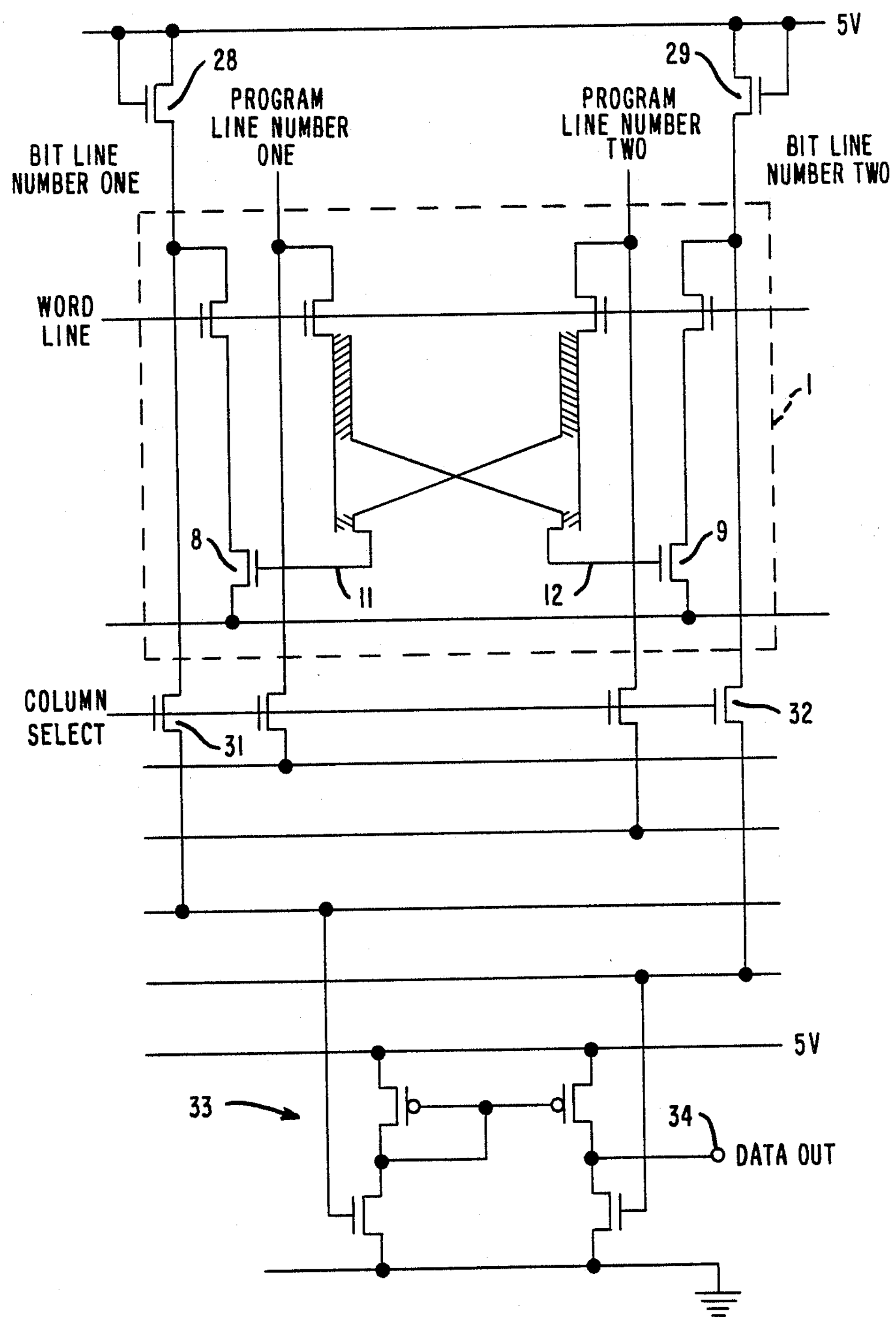
FIG. 3 is a schematic illustrating the placement of a high speed nonvolatile memory cell within an array having a differential nonvolatile data sensing means.

Differential conduction of floating gate sense transistors 8 and 9, relating to the voltage differential charge on floating gates electrodes 11 and 12, can be detected on bit lines number one and number two using a differential responsive sense amplifier, such as amplifier 33 as embodied in the cell array circuit of FIG. 3. Referring to FIG. 3, bit lines number one and number two are pull-up biased through load connected field effect transistors 28 and 29, and are coupled by way of column select field effect transistors 31 and 32 to the opposite sides of voltage responsive sense amplifier 33. The binary state stored in nonvolatile memory cell 1 is represented by the voltage on data out line 34.

It should be understood that the differential character of the present cell consumes somewhat greater chip area, and consequently reduces function density, in comparison to that attainable using a non-differential configuration. However, the differential arrangement provides a nonvolatile cell with distinctly superior readout speed. In contrast to conventional nonvolatile cells, the output state of the present cell can be detected almost immediately, in that sensing is differentially responsive. The delays associated with transient decays when comparing to a fixed reference voltage are obviated. Futhermore, the differential configuration effectively doubles the memory cell window, which window margin is used by differential detection to accentuate speed.

The voltages shown by parentheses in Table A represent alternate arrangements. For example, the +5 volt bias voltages coupled floating gate electrodes 11 and 12 from program lines number one and number two during the read operation are preferred but not mandatory conditions. Such biasing of the two floating gate electrodes by +5 volts during reading will shift the operating ranges of floating gate sense transistors 8 and 9 to regions of higher gain, so as to further accentuate the effective difference represented by the complementary charged states of the two floating gate electrodes.

The high speed direct write differential nonvolatile memory cell of the present invention also provides the user with a memory margining capability, which capability is suitable for product acceptance testing or for data verification. The margining conditions are also set forth in Table A. For margin testing, bit lines number one and number two are connected to the sense amplifier while the test voltages are applied individually through the program lines. Preferably, memory margining is done with positive voltages. This avoids the need for negatively biasing the substrate or p-well to prevent inadvertent forward biasing of pn junctions. The differential operation of the cell facilitates memory margin testing by virtue of the symmetry of structure and operation. Because the test voltage used to bias the selected program line causes a cell response which is indicative of a threshold voltage difference between the two floating gate sense transistors, rather than an absolute voltage, multiple cells in an array can first be programmed to a data "0" state and tested using one program line for margining, followed by a reprogramming to the opposite "1" state and similar margining using one other program line. Thereby, both the "0" and "1" states are measured while avoiding the use of negative voltages.

This margining approach can also be used to evaluate the performance of a memory cell after an extended period of time following a program/write cycle. For example, the sensing of thresholds via one and then the other of the program lines can be used to test retention or to "peek" at the state of the memory cell in actual use. However, it should recognize that "peeking" will subject the cell to limited programming conditions by virtue of the voltages impressed across the charge transfer dielectrics.

As is no doubt apparent from considering FIGS. 2 and 3, direct write differential nonvolatile memory cell 1 is by virtue of its functional and structural symmetry very suitable for implementation in arrays. In such applications it is foreseeable that the benefits of the high operating speed, the structural and functional symmetry, and the single polysilicon fabrication capability will lead to applications beyond semicustom integrated circuit products. In considering such broader, array type applications, another beneficial aspect of the cell may be exercised. When suitable for the array as a whole, cell access transistors 4 and 6 may be operationally grouped by commonly connecting gate electrodes of multiple cells to provide a block programming capability.

The direct write differential nonvolatile memory cell configuration described herein thereby provides not only accentuated read rate capability for an EEPROM cell, but also exhibits a direct write capability, memory window margining capability, symmetry as to both structure and functions, and amenability to being fabricated using a relatively conventional single polysilicon process technology. Furthermore, the cell is configured to allow the partition of the relatively high programming voltage, so that individual transistor voltages are limited to magnitudes which can be handled by very large scale integrated field effect devices of conventional and advanced design.

I claim:

1. A direct write differential nonvolatile memory cell addressable by a word line and two bit lines, comprising:

- a first conductive path in a semiconductor substrate, between a first bit line and a first node, including therein a serial connection of a first word line operable cell access transistor and a first floating gate sense transistor;
- a second conductive path in the semiconductor substrate, between a second bit line and a second node, including therein a serial connection of a second word line operable cell access transistor and a second floating gate sense transistor;
- first and second electrodes respectively connected to first and second program lines;
- a first floating gate electrode for controlling the first floating gate sense transistor, having a first relatively small capacitive coupling to the first program line electrode and a second relatively large capacitive coupling to the second program line electrode; and
- a second floating gate electrode for controlling the second floating gate sense transistor, having a first relatively small capacitive coupling to the second program line electrode and a second relatively large capacitive coupling to the first program line electrode.

2. The apparatus recited in claim 1, further including first and second program line cell access transistors, respectively disposed between the first and second program line electrodes and first and second program lines.

3. The apparatus recited in claim 2, wherein the first and second program line cell access transistors are connected to be responsive to the signal on the word line.

4. The apparatus recited in claim 3, wherein charge is transferred between the first floating gate electrode and the first program line electrode, and between the second floating gate electrode and the second program line electrode.

5. The apparatus recited in claim 4, wherein the first and second nodes are commonly connected and biased.

6. The apparatus recited in claim 4, wherein a commonly formed layer of integrated circuit material provides a dielectric for the first and second capacitive coupling of the first and second floating gate electrodes.

7. The apparatus recited in claim 4, wherein a commonly formed first layer of conductive polysilicon creates the first floating gate electrode, the second floating gate electrode, and the word line.

8. The apparatus recited in claim 1, wherein charge is transferred between the first floating gate electrode and the first program line electrode, and between the second floating gate electrode and the second program line electrode.

9. The apparatus recited in claim 8, wherein the first and second nodes are commonly connected and biased.

10. The apparatus recited in claim 8, wherein a commonly formed layer of integrated circuit material provides a dielectric for the first and second capacitive coupling of the first and second floating gate electrodes.

11. The apparatus recited in claim 8, wherein a commonly formed first layer of conductive polysilicon creates the first floating gate electrode, the second floating gate electrode, and the word line.

12. A floating gate direct write differential nonvolatile memory cell in a semiconductor substrate, comprising:

- a first conductive path along one side of the cell between a first bit line connection and a common node, having serially connected therein a first cell access transistor, formed at the intersection with an orthogonally oriented word line electrode of polysilicon, and a first floating gate sense transistor, formed at the intersection with an orthogonally oriented first floating gate electrode of polysilicon;
- a second conductive path substantially parallel to the first conductive path, and along the opposite side of the cell between a second bit line connection and the common node, having serially connected therein a second cell access transistor, formed at the intersection with a continuation of the orthogonally oriented word line electrode of polysilicon, and a second floating gate sense transistor, formed at the intersection with an orthogonally oriented second floating gate electrode of polysilicon; and
- a substrate region situated between the first and second conductive paths, having a first program line electrode which is relatively lightly capacitively coupled to the first floating gate electrode and relatively heavily capacitively coupled to the second floating gate electrode, and a second program line electrode which is relatively lightly capacitively coupled to the second floating gate electrode and relatively heavily capacitively coupled to the first floating gate electrode.

13. The apparatus in claim 12 wherein the capacitive coupling is created by layers of thin dielectric situated between program line electrodes diffused in the substrate and the floating gate electrode polysilicon, which dielectric is subject to charge transfer through the regions of light capacitive coupling.

14. The apparatus in claim 13, wherein the thin dielectrics are formed from oxides or nitrides of silicon.

15. The apparatus recited in claim 14, wherein the first and second program line electrodes in the substrate are substantially parallel to the first and second conductive paths, and include respective serially connected first and second program line cell access transistors between respective input connections to the first and second program line electrodes and their respective regions of relatively heavy capacitive coupling, and the first and second program line cell access transistors being responsive to the orthogonally oriented word line electrode.

* * * * *